United States Patent
Mao et al.

(10) Patent No.: US 7,989,859 B2
(45) Date of Patent: Aug. 2, 2011

(54) BACKSIDE ILLUMINATED IMAGING SENSOR WITH SILICIDE LIGHT REFLECTING LAYER

(75) Inventors: Duli Mao, Sunnyvale, CA (US);
Hsin-Chih Tai, Cupertino, CA (US);
Vincent Venezia, Sunnyvale, CA (US);
Howard E. Rhodes, San Martin, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 194 days.

(21) Appl. No.: 12/142,678

(22) Filed: Jun. 19, 2008

(65) Prior Publication Data

US 2009/0200586 A1 Aug. 13, 2009

Related U.S. Application Data

(60) Provisional application No. 61/027,364, filed on Feb. 8, 2008.

(51) Int. Cl.
*H01L 31/062* (2006.01)
(52) U.S. Cl. ........ 257/292; 257/233; 257/291; 257/433; 257/E27.13; 257/E27.133; 257/E25.032; 438/48; 438/72; 438/73
(58) Field of Classification Search .................. 257/292, 257/233, 291, 433, E27.13, E27.133, E25.032; 438/48, 72, 73
See application file for complete search history.

(56) References Cited

U.S. PATENT DOCUMENTS

| | | | |
|---|---|---|---|
| 5,416,344 A | 5/1995 | Ishizuya et al. | |
| 6,429,036 B1 | 8/2002 | Nixon et al. | |
| 6,504,193 B1 * | 1/2003 | Ishiwata et al. | 257/291 |
| 2005/0056902 A1 | 3/2005 | Abe et al. | |
| 2006/0076590 A1 * | 4/2006 | Pain et al. | 257/294 |
| 2006/0086956 A1 * | 4/2006 | Furukawa et al. | 257/291 |
| 2007/0001100 A1 | 1/2007 | Hsu et al. | |
| 2007/0259463 A1 | 11/2007 | Abedini | |
| 2009/0078973 A1 * | 3/2009 | Hsu et al. | 257/292 |

OTHER PUBLICATIONS

PCT/US2008/088333, PCT International Search Report and Written Opinion of the International Searching Authority, mailed Mar. 19, 2009, 9 pages.

* cited by examiner

*Primary Examiner* — Benjamin P Sandvik
*Assistant Examiner* — Farid Khan
(74) *Attorney, Agent, or Firm* — Blakely Sokoloff Taylor & Zafman LLP

(57) ABSTRACT

A backside illuminated imaging sensor includes a semiconductor layer, a metal interconnect layer and a silicide light reflecting layer. The semiconductor layer has a front surface and a back surface. An imaging pixel that includes a photodiode region is formed within the semiconductor layer. The metal interconnect layer is electrically coupled to the photodiode region and the silicide light reflecting layer is coupled between the metal interconnect layer and the front surface of the semiconductor layer. In operation, the photodiode region receives light from the back surface of the semiconductor layer, where a portion of the received light propagates through the photodiode region to the silicide light reflecting layer. The silicide light reflecting layer is configured to reflect the portion of light received from the photodiode region.

17 Claims, 3 Drawing Sheets

BACKSIDE ILLUMINATED IMAGING SENSOR WITH SILICIDE LIGHT REFLECTING LAYER

REFERENCE TO PRIOR APPLICATION

This application claims the benefit of U.S. Provisional Application No. 61/027,364, filed Feb. 8, 2008, hereby incorporated by reference.

TECHNICAL FIELD

This disclosure relates generally to imaging sensors, and in particular but not exclusively, relates to backside illuminated imaging sensors.

BACKGROUND INFORMATION

Many semiconductor imaging sensors today are front side illuminated. That is, they include imaging arrays that are fabricated on the front side of a semiconductor wafer, where light is received at the imaging array from the same front side. However, front side illuminated imaging sensors have many drawbacks, one of which is a limited fill factor.

Backside illuminated imaging sensors are an alternative to front side illuminated imaging sensors that address the fill factor problems associated with front side illumination. Backside illuminated imaging sensors include imaging arrays that are fabricated on the front surface of the semiconductor wafer, but receive light through a back surface of the wafer. However, to detect light from the backside, the wafer must be extremely thin. Color filters and micro-lenses may be included on the back surface of the wafer in order to improve the sensitivity of the backside illuminated sensor. The thickness of the wafer may be optimized in order to improve the sensitivity and reduce crosstalk. However, higher sensitivity typically results in higher crosstalk. That is, as the final semiconductor wafer thickness is increased, light can be more effectively collected by the wafer. At the same time, light intended for one pixel may have a higher possibility (or greater chance) of reaching other pixels that were not intended to receive the light. Thus, a need exists for a backside illuminated device with improved sensitivity that reduces crosstalk.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Imaging Sensor with Silicide Light Reflecting Layer are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
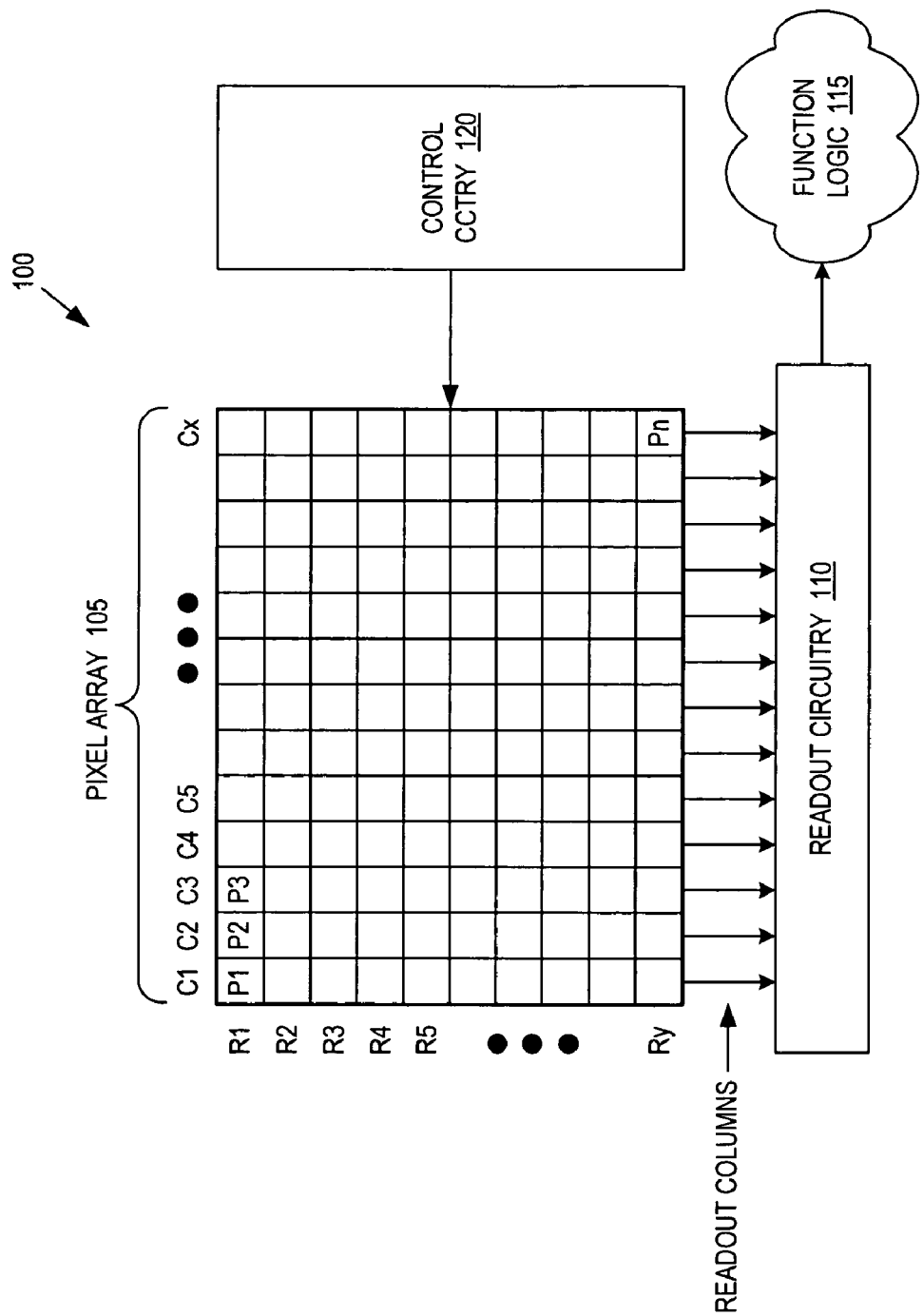
FIG. 1 is a block diagram illustrating a backside illuminated imaging sensor, in accordance with an embodiment of the invention.

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
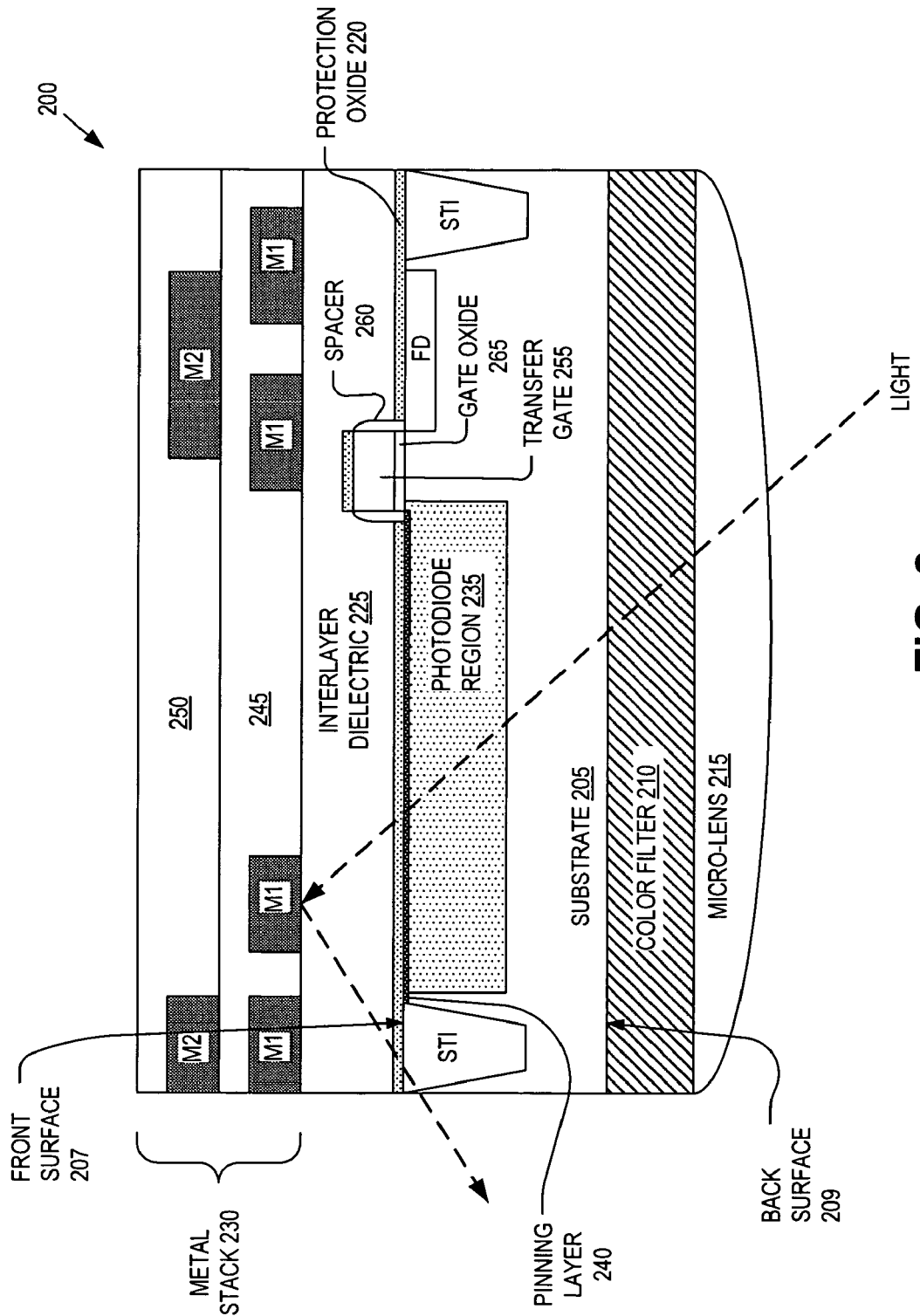
FIG. 2 is a cross-sectional view of an imaging pixel of a backside illuminated imaging sensor.

FIG. 2 is a cross-sectional view of an imaging pixel 200 of a backside illuminated imaging sensor. The illustrated embodiment of imaging pixel 200 includes a semiconductor layer (i.e., semiconductor substrate 205), a color filter 210, a micro-lens 215, a protection oxide 220, an interlayer dielectric 225, and a metal stack 230. Semiconductor substrate 205 is illustrated as including shallow trench isolations ("STI"), photodiode region 235, a floating diffusion ("FD"), and a pinning layer 240. Metal stack 230 is illustrated as including metal interconnect layers M1 and M2, and intermetal dielectric layers 245 and 250. Also illustrated in FIG. 2 is a transfer gate 255 having coupled thereto sidewall spacers 260 and a gate oxide 265.

In the illustrated embodiment of FIG. 2, photodiode region 235 is formed on a front surface 207 of semiconductor substrate 205 and is configured to receive light from back surface 209. Photodiode region 235 is illustrated as a pinned photodiode by way of optional pinning layer 240. In one embodiment, photodiode region 235 may be an unpinned photodiode or a partially pinned photodiode. Additionally, photodiode region 235 may be any photosensitive element, such as a photogate or photocapacitor. Furthermore, the term pixel as used herein is meant to encompass all pixel designs, including CCD pixels.

Coupled to back surface 209 is an optional color filter 210 to implement a color sensor and micro-lens 215 to focus light onto photodiode region 235. Coupled to front surface 207 is protection oxide 220 and interlayer dielectric 225. In one embodiment interlayer dielectric 225 is silicon oxide. Also included in imaging pixel 200 is transfer gate 255 which is coupled to transfer charge that is accumulated in photodiode region 235 to floating diffusion FD. In one embodiment, transfer gate 255 is a polycrystalline silicon (i.e., polysilicon) structure.

As shown in FIG. 2, imaging pixel 200 includes metal stack 230. The illustrated embodiment of metal stack 230 includes two metal layers M1 and M2 separated by intermetal dielectric layers 245 and 250. Although FIG. 2 illustrates a two layer metal stack, metal stack 230 may include more or less metal layers for routing signals above front surface 207 of substrate 205. In one embodiment metal interconnect layers MI and M2 are a metal such as aluminum, copper, or other alloy. In one embodiment, metal interconnect layers MI and M2 are formed by way of sputtering, collimated sputtering, low pressure sputtering, reactive sputtering, electroplating, chemical vapor deposition or evaporation. In one embodiment, transfer gate 255 and floating diffusion FD are electrically coupled to one or more of metal interconnect layers M1 and M2 by way of a hole, via or other connection means (not shown) through protection oxide 220 and interlayer dielectric 225. In one embodiment, a passivation layer (not shown) is disposed over metal stack 230.

During operation, incident light is received at micro-lens 215, which focuses the light through color filter 210 to back surface 209 and through substrate 205 to be received by photodiode region 235. Electron-hole pairs are generated in response to the received light. The electrons are then collected in photodiode region 235, transferred to floating diffusion (FD), and converted into electrical signals. However, as seen in FIG. 2, a portion of the light received at photodiode region 235 may continue propagating through front surface 207 of substrate 205. In some instances this light continues into one or more of the intermetal dielectric layers (e.g., 245 and 250) and is reflected by the metal layers (e.g., M1 and M2) back towards a different (e.g., adjacent) pixel, where an electrical signal is generated in response to the reflected light in this different pixel. Light reflecting back to an adjacent or different pixel in this manner is referred to herein as "optical crosstalk" and increases noise and reduces the quality in the resulting image produced by a pixel array.

In one example, pixel 200 is configured to receive substantially only light in the red frequency range by way of color filter 210 being a red color filter. An adjacent pixel (not shown) may be similarly configured to received substantially only light in the green frequency range by way of a green color filter. In this example, light is received at micro-lens 215, then filtered into red light by color filter 210 where the red light then propagates through substrate 205 to photodiode region 235. An electrical signal representative of the red light received is then generated in photodiode region 235. A portion of the red light then continues propagating through front surface 207 and is reflected off of metal interconnect layer MI towards the adjacent pixel. Now, in the adjacent pixel electrical signals are generated not only in response to green light that passed through the corresponding green color filter, but also from the red light reflected from pixel 200. Thus, the resulting image produced by the pixel array may have inaccurate color values generated as a result of this optical crosstalk. That is, the adjacent pixel may output a higher value as a result of the combined green and reflected red light. Additional optical crosstalk may result from light being reflected off of other metal interconnect layers, such as M2.

Figure 3:
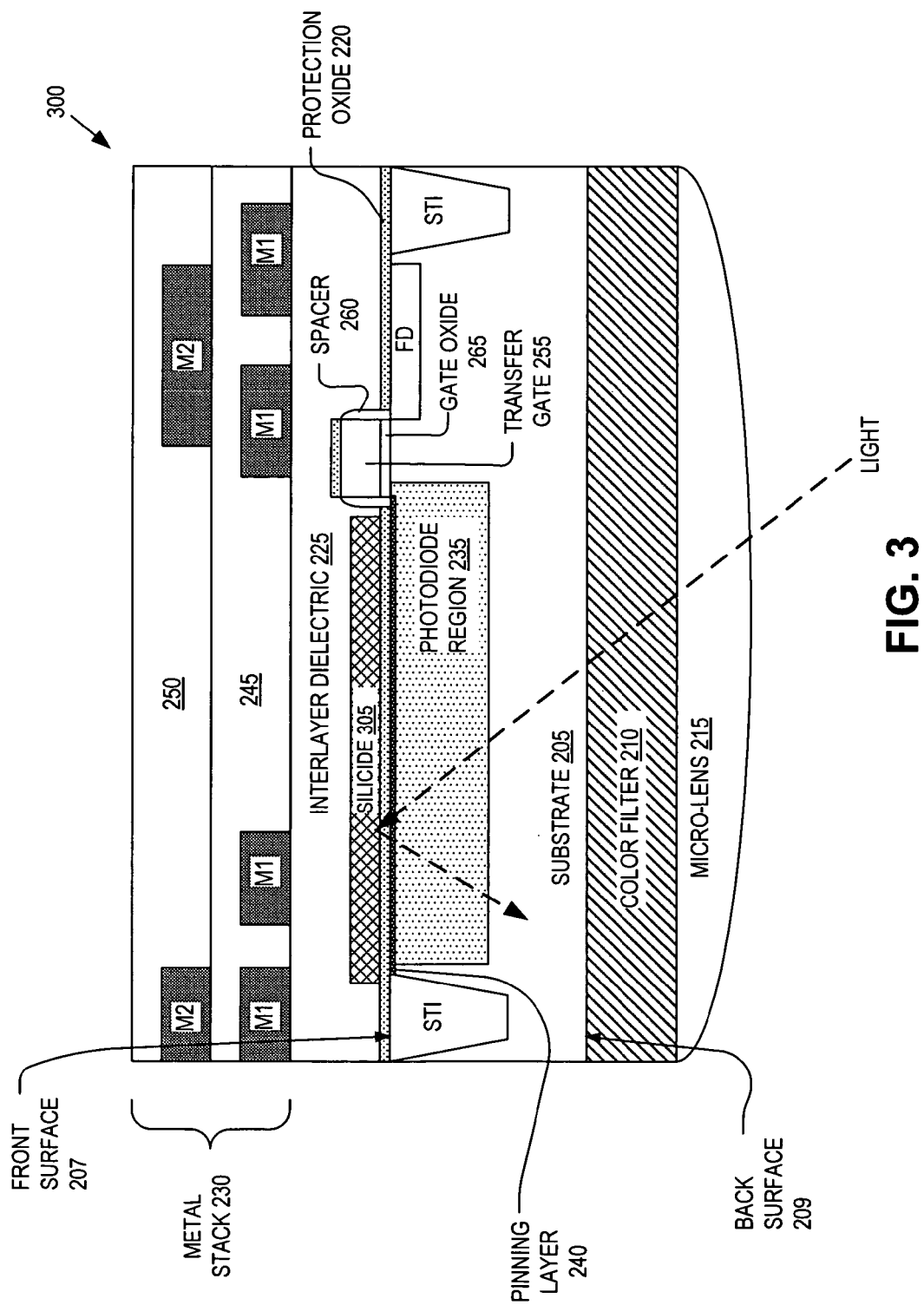
FIG. 3 is a cross-sectional view of an imaging pixel of a backside illuminated imaging sensor, in accordance with an embodiment of the invention.

FIG. 3 is a cross-sectional view of an imaging pixel 300 of a backside illuminated imaging sensor, in accordance with an embodiment of the invention. Imaging pixel 300 is one possible implementation of at least one pixel of pixel array 105 shown in FIG. 1. The illustrated embodiment of imaging pixel 300 includes semiconductor substrate 205, color filter 210, micro-lens 215, protection oxide 220, interlayer dielectric 225, metal stack 230, and a silicide light reflecting layer 305.

As shown in FIG. 3, imaging pixel 300 includes silicide light reflecting layer 305 disposed between metal stack 230 and front surface 207 of semiconductor substrate 205. Silicide light reflecting layer 305 is configured to reflect light that continues propagating through photodiode region 235 back to the same photodiode region 235 in order to reduce the optical crosstalk. In one embodiment, silicide light reflecting layer 305 is disposed above protection oxide 220. Protection oxide 220 may be previously formed to a thickness that is relatively thin such that silicide light reflecting layer 305 is in close proximity to photodiode region 235 so as to ensure that light that propagates through photodiode region 235 is reflected back onto the same photodiode region 235 and not onto an adjacent pixel. In one embodiment, silicide light reflecting layer 305 is disposed above the photodiode region 235 and not above floating diffusion FD or transfer gate 255.

In one embodiment, silicide light reflecting layer 305 is a layer of silicide. In this embodiment, the layer of silicide is formed after protection oxide 220 is deposited onto front surface 207 of semiconductor substrate 205. First, a thin layer of polysilicon is deposited over protection oxide 220. In one embodiment, the thickness of the polysilicon layer is between 10 nm and 100 nm. In one embodiment, photo and etch steps are then performed to remove the polysilicon layer from everywhere except over photodiode region 235.

In one embodiment, the deposition of the polysilicon layer is configured to reduce polysilicon deposition along transistor spacer sidewalls (e.g., spacers 260). For example, the deposition of the polysilicon layer may be configured to be more anisotropic rather than isotropic and the subsequent selective etch may include a high amount of over-etch. Protection oxide 220 may act as an etch stop layer for the etching of the polysilicon layer. Thus, the thickness of protection oxide 220 may need to be configured to accommodate this over-etch of the polysilicon layer.

After the patterning of the layer of polysilicon, protection oxide 220 may be patterned and etched for other areas of imaging pixel 300 that may be desired to be silicided. Silicide is then formed following a typical CMOS process flow. For example, silicide may be formed or deposited by the processes of coevaporation, sputtering, or vacuum deposition followed by thermal annealing. These processes may produce a silicide light reflecting layer 305 that results from a metal reacting with the polysilicon to form the silicide or in the alternative, silicide light reflecting layer 305 may be a mixture of codeposited metal and silicon. In one example, silicide light reflecting layer 305 may be formed by a self-aligned process of salicidation.

In one embodiment, silicide light reflecting layer 305 is a layer of tungsten silicide. In this embodiment, the tungsten silicide layer is deposited nonconformally on protection oxide 220 by way of a physical vapor deposition process. Thus, in this embodiment, silicide light reflecting layer 305 can be deposited after typical salicidation steps, giving more flexibility to the fabrication process of imaging pixel 300. In other embodiments, silicide light reflecting layer 305 is a layer of titanium silicide or cobalt silicide.

In operation of imaging pixel 300, incident light is received at micro-lens 215, which focuses the light through color filter 210 to back surface 209 and through substrate 205 to be received by photodiode region 235. Electrical signals are then generated in photodiode region 235 in response to the received light where these electrical signals are routed through one or more of the metal layers of metal stack 230. As with the previous example, a portion of the light received at photodiode region 235 may continue propagating through front surface 207 of substrate 205. However, with the inclusion of silicide light reflecting layer 305, the light is reflected back to the same photodiode region 235 rather than an adjacent pixel. Electrical signals are then generated in the same photodiode region 235 in response to this reflected light. Thus, the inclusion of silicide light reflecting layer 305 in close proximity to front surface 207 of the semiconductor substrate substantially prevents light received at one photodiode region from being reflected onto another photodiode region, thereby reducing the optical crosstalk discussed above. In addition, silicide light reflecting layer 305 may increase the sensitivity of photodiode region 235 by reflecting light that has already passed through photodiode region 235 back into the same photodiode region.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated imaging sensor, comprising:
   a semiconductor layer having a front surface and a back surface, the semiconductor layer having an imaging pixel that includes a photodiode region formed within the semiconductor layer;
   a metal interconnect layer electrically coupled to the photodiode region;
   a protection oxide disposed on the front surface of the semiconductor layer;
   a silicide light reflecting layer disposed on the protection oxide, wherein the photodiode region receives light from the back surface of the semiconductor layer, where a portion of the received light propagates through the photodiode region to the silicide light reflecting layer, wherein the silicide light reflecting layer is configured to reflect the portion of light received from the photodiode region;
   a gate oxide disposed on the front surface of the semiconductor layer; and
   a transfer gate disposed on the gate oxide between the photodiode region and a floating diffusion region formed on the front surface of the semiconductor layer, wherein the silicide light reflecting layer is disposed above the photodiode region, not above the floating diffusion region and is laterally displaced from the transfer gate such that the silicide light reflecting layer is not above the gate oxide of the transfer gate, wherein the protection oxide has a thickness less than a thickness of the transfer gate.

2. The backside illuminated imaging sensor of claim 1, wherein the silicide light reflecting layer is configured to substantially prevent the portion of the light received from the photodiode from being reflected onto an adjacent photodiode region.

3. The backside illuminated imaging sensor of claim 1, further comprising a dielectric layer disposed between the silicide light reflecting layer and the metal interconnect layer.

4. The backside illuminated imaging sensor of claim 1, wherein the silicide light reflecting layer is a layer of tungsten silicide.

5. The backside illuminated imaging sensor of claim 1, wherein the imaging pixel is a complementary metal-oxide-semiconductor ("CMOS") backside illuminated imaging pixel.

6. The backside illuminated imaging sensor of claim 1, wherein the silicide light reflecting layer is a layer of polysilicon silicide.

7. The backside illuminated imaging sensor of claim 1, wherein the silicide light reflecting layer is a layer of material selected from the group consisting of titanium silicide and cobalt silicide.

8. The backside illuminated imaging sensor of claim 1, further comprising:
   a micro-lens disposed on the back surface of the semiconductor layer below the photodiode region and optically aligned to focus light through the back surface of the semiconductor layer onto the photodiode region; and
   a color filter disposed between the micro-lens and the photodiode region to filter the light.

9. The backside illuminated imaging sensor of claim 1, wherein the silicide light reflecting layer is a self-aligned layer of silicide.

10. An imaging sensor, comprising:
    a semiconductor layer having a front surface and a back surface, the semiconductor layer having a backside illuminated array of imaging pixels, wherein each imaging pixel includes:
       a photodiode region formed within the semiconductor layer;
       a metal interconnect layer electrically coupled to the photodiode region;
       a protection oxide disposed on the front surface of the semiconductor layer;
       a silicide light reflecting layer disposed on the protection oxide, wherein the photodiode region receives light from the back surface of the semiconductor layer, where a portion of the received light propagates through the photodiode region to the silicide light reflecting layer, wherein the silicide light reflecting layer is configured to reflect the portion of light received from the photodiode region;
       a gate oxide disposed on the front surface of the semiconductor layer; and
       a transfer gate disposed on the gate oxide between the photodiode region and a floating diffusion region formed on the front surface of the semiconductor layer, wherein the silicide light reflecting layer is disposed above the photodiode region, and not above the floating diffusion region and is laterally displaced from the transfer gate such that the silicide light reflecting layer is not above the gate oxide of the transfer gate, wherein the protection oxide has a thickness less than a thickness of the transfer gate.

11. The imaging sensor of claim 10, further comprising a dielectric layer disposed between the silicide light reflecting layer and the metal interconnect layer.

12. The imaging sensor of claim 10, wherein each imaging pixel is a complementary metal-oxide-semiconductor ("CMOS") backside illuminated imaging pixel.

13. The imaging sensor of claim 10, wherein the silicide light reflecting layer is a layer of a silicide of polysilicon.

14. The backside illuminated imaging sensor of claim 1, further comprising a sidewall spacer disposed on a sidewall of the transfer gate between the transfer gate and the silicide light reflecting layer.

15. The backside illuminated imaging sensor of claim 1, wherein the protection oxide is further disposed on the transfer gate.

16. The imaging sensor of claim 10, further comprising a sidewall spacer disposed on a sidewall of the transfer gate between the transfer gate and the silicide light reflecting layer.

17. The imaging sensor of claim 10, wherein the protection oxide is further disposed on the transfer gate.

\* \* \* \* \*